(12) United States Patent
Cutler

(10) Patent No.: US 12,187,954 B1
(45) Date of Patent: Jan. 7, 2025

(54) SiC-FILLED POLYMERS WITH HIGH ELECTRICAL RESISTIVITY AND HIGH THERMAL CONDUCTIVITY

(71) Applicant: Raymond Ashton Cutler, Bountiful, UT (US)

(72) Inventor: Raymond Ashton Cutler, Bountiful, UT (US)

(73) Assignee: WASHINGTON MILLS MANAGEMENT, INC., Grafton, MA (US)

( * ) Notice: Subject to any disclaimer, the term of this patent is extended or adjusted under 35 U.S.C. 154(b) by 0 days.

(21) Appl. No.: 17/530,451

(22) Filed: Nov. 18, 2021

Related U.S. Application Data

(60) Provisional application No. 63/125,365, filed on Dec. 14, 2020.

(51) Int. Cl.
  *C09K 5/14* (2006.01)
  *C08K 3/28* (2006.01)
  (Continued)

(52) U.S. Cl.
  CPC ................ *C09K 5/14* (2013.01); *C08K 3/28* (2013.01); *C08K 3/34* (2013.01); *C08K 3/38* (2013.01); *C08K 9/02* (2013.01); *C08K 2003/282* (2013.01); *C08K 2003/385* (2013.01); *H01L 23/3733* (2013.01)

(58) Field of Classification Search
  CPC ............. C09K 5/08; C09K 5/14; H01B 3/12; H01B 3/40; C08K 3/11; C08K 3/14; C08K 3/28; C08K 3/34; C08K 3/38; C08K 9/02; C08K 9/10; C08K 2003/282; C08K 2003/385; C08K 2201/001; C08K 2201/011; C08K 2201/014; H01L 34/3733

See application file for complete search history.

(56) References Cited

U.S. PATENT DOCUMENTS 4,124,667 A * 11/1978 Coppola ............... C04B 35/565
                                                     501/92
4,135,937 A *  1/1979 Murata ................. C04B 35/575
                                                     501/92
(Continued)

FOREIGN PATENT DOCUMENTS

CN      105367959 A  *  3/2016
CN      110938288 A  *  3/2020
(Continued)

OTHER PUBLICATIONS

Zhou et al. ("Study of the thermal conduction mechanism of nano-SiC/DGEBA/EMI-2,4 composites," Polymer 49, 2008, 4666-4672) (Year: 2008).*

(Continued)

*Primary Examiner* — Matthew R Diaz
(74) *Attorney, Agent, or Firm* — Finch & Maloney PLLC

(57) ABSTRACT

A thermal interface material is made by dispersing in a polymer, such as epoxy, silicone, or urethane, silicon carbide particles which have been previously oxidized to form a strongly adherent insulating layer. The attractive combination of high thermal conductivity and high electrical resistivity is achieved by controlling the thickness of the oxide layer and the loading of the ceramic particles in the polymer matrix.

28 Claims, 6 Drawing Sheets

(51) Int. Cl.
*C08K 3/34* (2006.01)
*C08K 3/38* (2006.01)
*C08K 9/02* (2006.01)
*H01L 23/373* (2006.01)

(56) References Cited

U.S. PATENT DOCUMENTS

| | | | | |
|---|---|---|---|---|
| 8,815,396 | B2* | 8/2014 | Bakshi | B82Y 30/00 |
| | | | | 428/404 |
| 9,028,959 | B2* | 5/2015 | Iwayama | H01L 23/3736 |
| | | | | 428/312.6 |
| 2007/0097651 | A1* | 5/2007 | Canale | C09K 5/14 |
| | | | | 257/E23.113 |
| 2013/0202882 | A1* | 8/2013 | Uchida | C08K 3/38 |
| | | | | 428/221 |
| 2013/0272947 | A1* | 10/2013 | Qadri | C01B 32/97 |
| | | | | 977/896 |
| 2015/0259589 | A1* | 9/2015 | Takagi | C09D 201/00 |
| | | | | 252/75 |
| 2017/0055339 | A1* | 2/2017 | Zhang | H05K 1/0373 |
| 2019/0249059 | A1* | 8/2019 | Maeda | C01B 32/956 |
| 2021/0040370 | A1* | 2/2021 | Yamashita | C08L 101/00 |

FOREIGN PATENT DOCUMENTS

| | | | | |
|---|---|---|---|---|
| CN | 111961337 A | * | 11/2020 | |
| KR | 1447258 B1 | * | 10/2014 | |
| WO | 2004108852 A | | 12/2004 | |
| WO | WO-2011125441 A1 | * | 10/2011 | ......... H01L 23/3733 |
| WO | WO-2012002079 A1 | * | 1/2012 | ............... C08K 3/22 |

OTHER PUBLICATIONS

Mun et al. ("Thermal and electrical properties of SiO2/SiC-epoxy composite by surface oxidation of silicon carbide," Thermochemica Acta 654, 2017, 70-73) (Year: 2017).*

Wu et al. ("Epoxy composites with surface modified silicon carbide filler for high temperature molding compounds," 2019 IEEE 69th Electronic Components and Technology Conference, 2019, 2134-2139) (Year: 2019).*

"DOWSIL SE 4445 CV Gel", Dow Technical Data Sheet, (2020-2023) 5 pages.

Harris, et al., "Surface preparation of silicon carbide for improved adhesive bond strength in armour applications," ELSEVIER, Journal of the European Ceramic Society 33 (2013). pp. 2925-2934.

"HYSOL EA 9396, Epoxy Paste Adhesive," Henkel, KRAYDEN, Inc. (Jun. 2002). 4 pages.

* cited by examiner

SiC-FILLED POLYMERS WITH HIGH ELECTRICAL RESISTIVITY AND HIGH THERMAL CONDUCTIVITY

CROSS REFERENCE TO RELATED APPLICATIONS

Priority is claimed from U.S. Provisional Patent Application 63/125,365, filed 14 Dec. 2020, which is hereby incorporated by reference

FEDERAL SUPPORT

This Invention was made with U.S. Government support under Contract No. DE-SC0018665 awarded by the Department of Energy. The Government has certain rights in this invention.

BACKGROUND

In the field of polymer-ceramic composites, more specifically to SiC-filled polymeric composites, are used as thermal interface materials, adhesives, potting compounds, bulk heat sinks, and associated applications.

A thermal interface material (TIM) is used to enhance heat conduction between a heat source and a heat sink. It is often desired that the TIM be both a thermal conductor and an electrical insulator in order to avoid electrical shorting through the TIM. Polymers are often used a part of the TIM since they can easily conform to both surfaces. While it is easy for the polymer to provide high electrical resistivity, they have notoriously low thermal conductivity with values typically below 0.5 W/mK and often in the range of 0.2-0.3 W/mK. Adding a thermally conductive filler can increase the thermal conductivity, but the interfacial resistance between the polymer and the filler limits heat transfer through the composite.

It is easy to get an order of magnitude increase in thermal conductivity by proper engineering of the filler, but such materials are often expensive due to the choice of filler and the method of alignment. For state-of-the-art TIM reviews see F. Zhang, et al, "Three-Dimensional Interconnected Networks for Thermally Conductivity Polymer Composites: Design, Preparation, Properties, and Mechanisms," *Mat. Sci. Eng.* R 142 100580 (2020); J. Khan, et al., "A Review on Advanced Carbon-Based Thermal Interface Materials for Electronic Devices," *Carbon* 168 65-112 (2020); J. Hansson, et al., "Novel Nanostructured Thermal Interface Materials: A Review," *Int. Mater.* Rev. 63 [1] 22-45 (2018). While most development is focused on aligned carbon nanotubes, graphene and graphite oxide fillers, the need exists for inexpensive TIMs for a wide variety of applications.

Fillers that work well as resistive TIMs have an electronic structure with a band gap above 6 eV. For example, alpha-alumina ($Al_2O_3$) has a band gap of 7.1 eV, aluminum nitride (AlN) is 6.2 eV, and boron nitride (BN) is 6.1 eV. Silicon carbide is a wide band gap semiconductor SiC with energies in the 2.2 to 3.4 eV range depending on the crystal structure and stacking sequence (3C, 2H, 4H, 6H, 15R, etc.). High electrical resistivity is achieved by eliminating, or compensating for, dopants (or impurities) that give n-type or p-type semiconducting properties. Vanadium is known as a deep donor and compensates for other dopants, pinning the Fermi level above 1.3 eV. At room temperature, vanadium doped single crystals have electrical resistivities as high as $10^{15}$ ohm-cm. As a semiconductor, resistivity decreases exponentially with increasing temperature.

Other approaches to achieve high resistivity are to compensate p-type donors with n-type donors. Due to the multiplicity of SiC materials available, they exist over a wide range from good electrical conductors to moderate insulating materials. Amorphous silica has high (>7 eV) band gap energies (*J. Am. Ceram. Soc.*, 86 [11] 1885-92 (2003)). In order to obtain high thermal conductivity in sintered silicon carbide, it is well known that removing the native silica surface layer on silicon carbide particles is necessary prior to sintering and that low thermal conductivity results from glassy grain boundaries (see J. Am. Ceram. Soc., 86 1812-14 (2003)). While a thin layer of silica protects bulk silicon carbide ceramics from oxidation, it is well understood that fine powders oxidize readily (see *Ceram. Int.* 33 309-313 (2007)), so SiC ceramics are processed in vacuum or under a protective gas such as He or Ar. When processed so that grain boundaries are clean, the thermal conductivity of SiC ceramics exceed 100 W/mK at room temperature. Thermal conductivity is a strong function of temperature and phonon mean free path, so it is possible to achieve values of several hundred W/mK for SiC single crystals.

Despite the wide variety of TIMs used today, there is no SiC-based filler material used in significant quantities due to its lower dielectric breakdown voltage compared to alumina, aluminum nitride, or boron nitride. While $Al_2O_3$ is inexpensive, AlN and BN are very expensive fillers. Because SiC is readily available as an abrasive in size-classified grits, it would be advantageous to be able to double the thermal conductivity of $Al_2O_3$-based materials and still have the prerequisite electrical resistivity. SiC-polymer composites are well known in the literature with SiC existing in the form of particulates, whiskers, fibers, nanorods, etc. Perhaps the best-known composites are SiC fiber-epoxy or SiC fiber-SiC matrix composites which can be used at low and high temperatures, respectively.

Preceramic polymer precursors can also be used to form silicon oxycarbide or silicon carbide at elevated temperatures. Oxidation treatments have been used to enhance wetting by the polymer without negatively affecting the thermal conductivity of the SiC-epoxy composites (see Zhao, et al., "Improved Thermal Conductivity of Epoxy Composites Using a Hybrid Multi-Walled Carbon Nanotube/Micro-SiC Filler," *Carbon* 48 1171-76 (2010) and Hwang, et al., "Fabrication of Surface-Treated SiC/Epoxy Composites Through a Wetting Method for Enhanced Thermal and Mechanical Properties," *Chem. Eng. J.* 246 229-237 (2014)) but no attention was paid to electrical resistivity or dielectric strength of the composites produced despite the fact that the researchers were working to make improved TIMs. This is not the result of ignorance, as Zhao at el. reported two orders of magnitude drop in electrical resistivity as the SiC content increased from 0 to 14 vol. % (see Zhao, et al. "Study on Mechanical, Thermal and Electrical Characterizations of Nano-SiC/Epoxy Composites," *Polymer J.* 41 [1] 51-57 (2009)). One can only conclude that they did not see an improvement in electrical resistivity based on their processing approach. It is well understood that the semiconducting properties of the SiC powder decreases the electrical resistivity of polymeric composites with increasing SiC content (see Kareem, "Enhanced Thermal and Electrical Properties of Epoxy/Carbon Fiber-Silicon Carbide Composites," *Adv. Comp. Lett.* 29 1-6 (2020)).

As SiC lowers the thermal expansion of the polymer composite, there is interest in having high volume loading of the SiC. The dielectric constant is higher for SiC than for the polymer matrix so there is some compromise in dielectric constant as the filler content increases. An example of using SiC as a filler for an adhesive in a semiconductor device is given in U.S. Pat. No. 8,004,048 where the inventors found that SiC by itself did not give high thermal conductivity and they needed to add Ag to increase the thermal conductivity, which of course increased the thermal expansion and lowered the electrical resistivity. The thermal conductivity of an epoxy-65 wt. % SiC composite was 2.0 W/mK with an electrical resistivity of <106 ohm-cm and a viscosity of above 25,000 mPa-s. High viscosity is associated with high volume loading and decreases the flowability of the adhesive.

SUMMARY

It is not obvious to one of ordinary skill in the art how to make a polymer-SiC composite with high thermal conductivity and high electrical resistivity simultaneously in an economical manner, while maintaining flowability.

It is an object of the present invention to prepare polymer-SiC composites with high thermal conductivity (>2.0 W/mK) and high electrical resistivity (>$10^{10}$ ohm-cm) in a manner that they can be made economically and in high volume, if desired, and can be made with good flowability so that they are easy to dispense. The present invention teaches how to do this and there are many variations that can be applied in order to make improved materials. This invention can be applied to thermal interface materials, bulk heat sinks, potting compounds, adhesives (including radiation-resistant adhesives), composite materials, and high-temperature filled cements (where the preceramic polymer can become amorphous, or crystallize, upon heating).

The present application teaches how to simultaneous achieve high thermal conductivity, high electrical resistivity, with economical polymers filled with SiC such that they are shear thinning and flow to fill void space. A higher thermal conductivity is achieved with a porosity less than 5% by volume.

In one embodiment, for example, high thermal conductivity is achieved by minimizing the number of polymer-SiC interfaces and by maximizing the SiC loading. This results in a high thermal conductivity and a low porosity. Bimodal particle size distributions allow high SiC volume loading and the choice of the particle size controls the thermal resistance. The choice of commercially available SiC grit is also important. In this embodiment the vast majority of the SiC particles are greater than one micrometer in diameter.

One embodiment for increasing the electrical resistivity by approximately three orders of magnitude is to preoxidize the SiC particles prior to incorporation into the SiC matrix, which is economically done in kilns readily available (e.g., pottery kilns). In order to achieve high electrical resistivity, the native oxide thickness on the SiC particles is increased by a controlled oxidation at elevated temperature in air. The oxygen-rich surface has poor thermal conductivity, but by keeping it thin relative to the total thickness of the particle it is possible to increase electrical resistivity by three orders of magnitude without substantially affecting the thermal conductivity. In one embodiment, the temperature for oxidation is the same for both size distributions. In another embodiment, the smaller size distribution is oxidized under conditions to decrease the oxide thickness relative to the larger size distribution.

In an embodiment, the viscosity of the polymerizable mixture of SIC particles and polymer is controlled by starting with a low-viscosity polymer in order to achieve high solids contents. In another embodiment, an environmentally-friendly diluent is added and then removed as the polymer is cured. Of course, dispersants, coupling agents, flow additives, wetting agents, and deairing chemicals are advantageous in this invention, as would be expected by someone of ordinary skill in the art. The choice of polymer is dictated by the application and polymers such as epoxies, silicones, urethanes, polyimides, copolymers, etc. can be used. In another embodiment, highly compressible silicone or urethane polymers are used and the viscosity of the polymer does not need to be low since there is no filling that occurs in the liquid state.

An aspect of the invention is a polymer-ceramic composite comprising silicon carbide particles in a polymer matrix, the silicon carbide particles have a surface oxide layer sufficiently thick to obtain volume electrical resistivity of the composite greater than $1\times10^{10}$ ohm-cm at 25° C. and 100V, the volume loading of the silicon carbide particles sufficient to obtain a thermal conductivity of the composite greater than 2.0 W/mK at 25° C., and a porosity less than 5% by volume. The surface oxide layer of at least a portion of the silicon carbide particles may be greater than 10 nm. The polymer-ceramic composite of claim 1 may have a volume electrical resistivity is greater than $1\times10^{11}$ ohm-cm at 25° C. and 100 V, thermal conductivity greater than 2.5 W/mK at 25° C., and porosity less than 5% by volume. The polymer-ceramic composite may have a volume electrical resistivity is greater than $1\times10^{12}$ ohm-cm at 25° C. and 100 V, thermal conductivity greater than 3.0 W/mK at 25° C., and porosity less than 2% by volume. The polymer-ceramic composite may have a volume electrical resistivity is greater than $1\times10^{12}$ ohm-cm at 25° C. and 100 V, thermal conductivity greater than 3.5 W/mK at 25° C., and porosity less than 1% by volume.

The polymer-matrix may comprise epoxy, urethane, or silicone. In the polymer-ceramic composite the silicon carbide particles have a bimodal size distribution. The volume loading of silicon carbide particles exceeds 50%. The native oxide layer on the silicon carbide particles may be increased by thermal oxidation. The silicon carbide particles may be comprised of alpha-SiC grit or grits subjected to an oxidation treatment prior to mixing with the polymer.

Another aspect of the invention is a polymer-ceramic composite comprising particles in a polymer matrix, the particles comprising; silicon carbide particles having a surface oxide layer sufficiently thick to obtain volume electrical resistivity of the composite greater than $1\times10^{10}$ ohm-cm at 25° C. and 100 V, ceramic particles with a higher dielectric strength than the silicon carbide particles, the polymer ceramic composite having sufficient particle loading for a thermal conductivity of the composite greater than 2.0 W/mK at 25° C., and a porosity less than 5% by volume. The ceramic particles with a higher dielectric strength than the silicon carbide particles may be an oxide, nitride, and/or oxynitride, such as aluminum nitride or boron nitride.

BRIEF DESCRIPTION OF DRAWINGS

The patent or application file contains at least one drawing executed in color. Copies of this patent or patent application publication with color drawings will be provided by the Office upon request and payment of the necessary fee.

DETAILED DESCRIPTION

Figure 1:
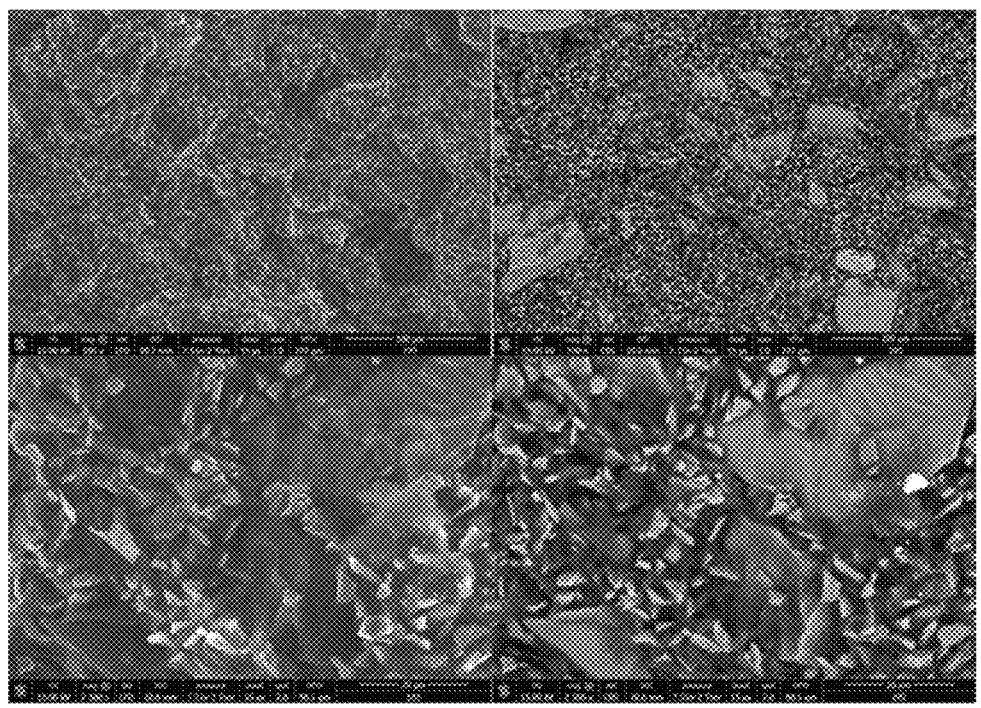
FIG. 1. Fracture surfaces of bimodal 240/1200 grit SiC at 55 vol. % using epoxy (Total Boat Penetrating). The thermal conductivity was 3.9 W/mK and the density was 2.32 g/cc (see Example 2).

Silicon carbide powder generally is available as beta-SiC (cubic crystal structure) or alpha-SiC (hexagonal or rhombohedral crystal structures) with many polytypes (stacking sequences) described by their repeat unit. The common 4H, 6H and 15R polytypes are therefore hexagonal with a repeat unit after each four planes in the c-direction (4H), six planes (6H), or 15 planes (rhombohedral unit cells can be converted to hexagonal unit cells). The stacking sequence slightly affects the band gap energy, with 2H, 4H, and 6H above 3.3 eV, while the 3C cubic material is about 2.2 eV. Electronic band structures are complex, but simply put SiC is called a wide band gap semiconductor because it has a wider spacing between the valence and conduction electron levels than silicon. Alpha SiC powders are prepared using the Acheson Process, a tonnage scale synthesis method that results in green (closer to the electrodes and slightly higher in purity) and black (typical material) grits which are size classified for abrasives. A wide variety of sizes are available commercially. Due to its brittle nature, the individual crystals are angular in nature, unless processed to give material that is typically used for metal-bonded abrasive wheels. The cost of SiC grit on a volume basis is about $1/10^{th}$ to $1/100^{th}$ the cost of AlN and BN. Diamond, with a band gap of 5.5 eV, is used as an abrasive in a variety of applications, and is often less expensive than AlN or BN, but is still at least an order of magnitude more expensive than SiC for the same volume loading.

All SiC has a native silica layer which can be removed with a HF wash. Hydrofluoric acid, however, is a hazardous chemical. Besides surface silica, other common impurities in SiC powders include $Fe_2O_3$, $Al_2O_3$, Si, and C. Acid washing can reduce the iron oxide, alumina, and free silicon. Thermal conductivity is controlled by phonon scattering and the largest impedance occurs at the SiC grain/polymer interface. The difference between black and green grades from the same supplier is insignificant compared to this Kapitza resistance at the polymer-SiC interface. For this reason, in polymer-ceramic composites, efforts are made to improve the coupling between the ceramic and the polymer. For example, in epoxy-SiC composites researchers have treated the SiC with HF, oxidized the powder at 900° C., and then used a silane compound to improve the coupling, showing slight improvements in thermal conductivity (see Zhao, et al. and Hwang, et al. in background section). Present work, however, has not shown any significant improvement in thermal conductivity using silanes, either with oxidized or unoxidized SiC powders. What controlled oxidation does accomplish is orders of magnitude increase in the electrical resistivity without substantially affecting the thermal conductivity. The surface chemistry of silica can be altered to make surfaces that are hydrophilic or hydrophobic, so it is certainly possible that improved surface coupling can occur. The present invention, however, relies on the excellent adhesion between the surface silica layer and the SiC so that the impedance at that interface is insignificant compared to the polymer-SiC interface.

The kinetics of the rate of oxidation of SiC has been known for a long time (see Jorgensen, et al. *J. Am. Ceram. Soc.* 42 [12] 613-16 (1959) and *J. Am. Ceram. Soc.*, 44 [6] 258-61 (1961)) and is influenced by the partial pressure of oxygen and/or water vapor. Since it is diffusion controlled, higher surface area powders have higher silica contents after oxidation.

Arrhenius behavior means that it is a thermally activated process and temperature drives the reaction exponentially and is more important than time at temperature. Impurities have also been known to affect the oxidation resistance of SiC powders (see Suzuki, *J. Ceram. Assoc. Japan*, 67 [6] 189-95 (1959)). Because the surface silica has a high band gap, it acts as an electrically insulating layer on the semiconducting SiC powder. By controlling the thickness of the silica layer, one can increase the electrical resistivity of the polymer-SiC composite. While it is possible to make SiC powders with high electrical resistivity using vanadium as a deep donor, this is an expensive process used for semiconductor devices. However, the controlled oxidation of SiC is an inexpensive process and is easily accomplished even in a stagnant bed.

Table 1 gives some data for commercially available powders. Panadyne is a distributor, while Washington Mills is a manufacturer. It is not known that the two different Panadyne materials purchased a year apart came from the same supplier. The Crystal grade particles from Washington Mills are expensive materials because they have been purified. All other grades are made in bulk quantities for abrasives and are very inexpensive. The data in Table 1 show the weight increase due to silica formation on the surface of the angular particles. In order to estimate the thickness of the silica layer, the assumption was that all the particles were spherical and for a given grade, had the same diameter. Since none of the grades are spherical, this is a conservative (overestimate) estimate of the layer thickness. It is clear that in all cases, the thickness is less than 0.15 µm and typically less than 0.1 µm. The volume change is less than 10% and in some cases is less than 1%. This means that the bulk of the SiC filler retains 90-99% of its unoxidized thermal conductivity yet has a thick enough silica layer to allow orders of magnitude increase in electrical resistivity.

TABLE 1

Oxidation of Silicon Carbide Powders

| Powder Company | Description Grade | Initial Mass (g) | Oxidation Temp. (° C.) | Conditions Time (hr) | Wt. Gain (%) | Est. Oxide Layer (nm)* | % Vol. Change |
|---|---|---|---|---|---|---|---|
| Panadyne | 240 grit green | 13.1 | 1000 | 10 | 0.20 | 25 | 0.3 |
| Panadyne | 1200 grit green | 4.8 | 1000 | 10 | 3.05 | 37 | 4.3 |
| W.M.** | 50 μm green crystal | 13.9 | 1000 | 10 | 0.20 | 25 | 0.3 |
| W.M.** | 5 μm green crystal | 8.1 | 1000 | 10 | 2.18 | 26 | 3.1 |
| W.M.** | 240 grit green (GWF) | 27.5 | 1100 | 10 | 0.98 | 119 | 1.4 |
| W.M.** | 240 grit black (BWF) | 29.6 | 1100 | 10 | 0.55 | 66 | 0.8 |
| W.M.** | 1200 grit green (GWF) | 17.2 | 1100 | 10 | 6.32 | 75 | 9.3 |
| W.M.** | 1200 grit black (BWF) | 14.9 | 1100 | 10 | 4.87 | 58 | 7.1 |
| W.M.** | 9 μm black (NG9) | 24.0 | 1100 | 10 | 1.12 | 25 | 1.6 |
| W.M.** | 5 μm black (NG5) | 21.1 | 1100 | 10 | 1.45 | 18 | 2.1 |
| Panadyne | 240 grit green | 2,150 | 1050 | 10 | 0.86 | 104 | 1.3 |
| Panadyne | 1200 grit green | 1,077 | 1050 | 10 | 6.05 | 72 | 8.7 |

*Assuming monosized spherical particles with a surface silica layer of density 2.2 g/cc
**Washington Mills Because the silica layer is still thin, it breaks down at a lower value than would occur for a filler where the entire particle had a high band gap. The process of oxidation adds very little to the cost and can be performed in a rotary kiln, such as is used for Portland cement production, but at a much-reduced temperature. To someone of ordinary skill in the art, it will be obvious that there are many ways to oxidize silicon carbide particles including chemical, electrochemical, plasma, etc. and the important teaching is to use a process that is inexpensive, results in uniform oxidation, and has minimal environmental impact.

McGeary (see *J. Am. Ceram. Soc.,* 44 [10] 513-522 (1961)) showed that bimodal or trimodal packing of spheres results in increased green density, where finer spheres can fit into the interstices between particles. Optimal green density occurs at a ratio of 2.3 for the coarse to fine fractions. In order to fit into the interstices, the larger spheres should be at least 7 times larger than the finer spheres. While, one does not obtain as high of green densities as McGeary did with constrained sequential additions, when powders are mixed, the same principle allows higher green densities than if only one size distribution is considered.

For thermal interface materials, the largest particle is limited in size by the gap size desired. In many instances, one only wants to eliminate the void space that exists between two flat surfaces and therefore nanosized fillers can be effective. However, in other applications, the thickness of the gap can be tens of micrometers in thickness. It is also worthwhile noting that grits represent a relative wide distribution, and in some cases, such as the narrow grits (NG) grades noted in Table 1, air classification has been used to make narrower size distributions for improved flowability. Elimination of fine particles in a distribution limits the number of polymer-SiC interfaces, reducing the Kapitza resistance. Since higher particle loading can result in improved thermal conductivity, a bimodal size distribution can be an effective method for increasing the SiC content while keeping the viscosity low enough to allow it to flow. The invention is not dependent on using multimodal particle size distributions, and in some cases one wants very small particles. The application will dictate the selection of SiC grit used.

It may be advantageous to add additional ceramic, or metallic, particles as fillers. Fine SiC may be useful in dispersing other components and whether the SiC is oxidized first is dependent on whether one desires an electrically conductive or electrically insulating composite. In certain instances, one needs a TIM and/or adhesive that is resistant to radiation. The type of radiation will dictate the selection of the polymer.

Mixing of the polymer/ceramic is typically done with high shear mixing equipment, but can also be accomplished with ball mills, vibratory mills, extrusion, injection molding, slip casting, or other forming equipment. The purpose of the mixing step is to disperse the ceramic filler in the polymer. Thermoplastic or thermosetting polymers may be used, the selection dictated by the application. Dispersants, wetting agents, deairing additives, couplers, or diluents can be used as is common in other applications where filled polymers are produced. Due to the rich interplay of variables, it is possible to optimize properties for a wide variety of applications including computers, LEDs, renewable energy, medical, telecommunications, consumer products, military, and industrial markets. The following examples give a glimpse into how simple and inexpensive this invention is, teaching principles, but not limiting the wide variety of polymer-SiC composites that are possible.

Examples 1-5 (Effect of Silane Coupler)

Green SiC grit was purchased from Panadyne (Montgomeryville, PA) as 240 grit (batch 5656-071119) or 1200 grit (batch 5656-072219). The mean particle sizes were claimed to be in the 50-53.3 μm and 4.5-6.5 μm ranges for the 240 and 1200 grits, respectively. Twenty grams of a silane coupling agent (3-aminopropyltriethoxysilane (Dow grade Xiameter OFS-60110)) was added to 100 ml of reagent grade isopropyl alcohol (IPA) and mixed. SiC powder (200 grams of 240 grit powder or 100 grams of 1200 grit) were added to the silane solution and boiled for 10 minutes, filtered, rinsed 3 times, and dried overnight at 110° C. to make silane coated powders. These were compared to uncoated powders. The third approach was to add the silane directly into the epoxy. A low viscosity epoxy (Total Boat Penetrating (TBP) distributed by Jamestown in Bristol, RI) was used with a dispersant (BYK 9076) and a deairing agent (Tego Airex 990). IPA was sometimes added as a diluent. A polyethylene terephthalate (PET) bottle approximately 25 mm in diameter and approximately 75 mm long was used for mixing using acoustic energy (Resodyn LabRam I, Butte, MT.) with the order of filling being liquids, followed by solids. The mixing occurred over a 7-minute time period with the acoustic energy (60 Hz) increasing in increments of 10 g from 10-50 g, with the last two minutes at 50 g. Viscosity was measured using a cone-on-plate viscometer (Brookfield CAP 2000+) at different shear rates. The mixture was poured into silicone molds and allowed to set overnight. The polymer composite was then cross-linked at 80° C. for 2 hours and surface ground to make samples that were approximately 0.5, 1.0, 1.5, 2.0, and 2.5 mm in thickness. The thermal conductivity was measured at Utah State University using a stepped bar apparatus (see Ralphs, et al., Meas. Sci. Technol. 27 115014 (2016)) so that when thermal impedance is plotted as function of sample thickness, the slope of the five data points is inversely related to the thermal conductivity. A thermal grease was used between the ground samples and the metal so the interfacial resistance (y-intercept) is not related to the filling of the polymer composite, since all samples are ground using the same diamond wheel. For this specific apparatus, samples approximately 9.5 mm in diameter were desired. The theoretical density was calculated based on Vegard's Law and measured using Archimedes displacement in water after vacuum infiltration.

As shown in Table 2, there is no evidence that coating the SiC particles with silane is beneficial to thermal conductivity, although Example 2 suggests that adding silane directly to the epoxy increases thermal conductivity. Adding a diluent, even though it evaporates from the system during heating results in lower densities. FIG. 1 gives evidence that the acoustic mixing, though short in duration, is able to distribute the two SiC distributions well within the epoxy.

TABLE 2

Composition and Properties of Examples 1-5

| Example | Mass (g) | | | | | | | | Viscosity | | Density | % | K |
| | Part A | Part B | IPA | 9076$^a$ | 990$^b$ | 6011$^c$ | 240$^d$ | 1200$^e$ | 64 s$^{-1}$ | 333 s$^{-1}$ | (g/cc) | T.D. | (W/mK) |
| --- | --- | --- | --- | --- | --- | --- | --- | --- | --- | --- | --- | --- | --- |
| 1 | 2.09 | 0.92 | 0.0 | 0.09 | 0.0 | 0.0 | 7.97 | 3.42 | 22,350 | 4,155 | 2.32 | >99 | 3.5 |
| 2 | 2.09 | 0.92 | 0.0 | 0.09 | 0.09 | 0.0 | 7.97 | 3.42 | 19,830 | 7,350 | 2.32 | >99 | 3.9 |
| 3 | 2.09 | 0.92 | 0.3 | 0.09 | 0.0 | 0.0 | 7.97$^f$ | 3.42 | 18,150 | 5,295 | 2.31 | >99 | 3.5 |
| 4 | 2.09 | 0.92 | 0.3 | 0.09 | 0.0 | 0.0 | 7.97 | 3.42 | 14,025 | 4,395 | 2.27 | 98.4 | 3.6 |
| 5 | 2.09 | 0.92 | 0.6 | 0.09 | 0.0 | 0.0 | 7.97$^f$ | 3.42$^f$ | 15,300 | 5,475 | 2.25 | 97.5 | 3.2 |

$^a$BYK 9076, $^b$Tego Airex 990, $^c$Xiameter OFS-6011, $^d$240 grit SiC, $^e$1200 grit SiC, and $^f$silane coated SiC Examples 6-12 (Effect of Silane and Oxidation)

High purity green SiC Crystal powder, with a d$_{50}$ of either 50 μm or 5 μm, produced in Norway by Washington Mills (Tonawanda, NY), was procured. It was compared to the Panadyne powders (see Examples 1-5) with and without silane added during mixing. In addition, oxidation of both sets of powders occurred simultaneously at 1000° C. for 10 hours (see Table 1) with heating rates of 100° C./hr inside Al$_2$O$_3$ containers in stagnant air. Processing and measurement of samples was similar to Example 1 except that different low viscosity epoxies were used. For Examples 6-11 Epo-Tek 301-1 (Epoxy Technology, Billerica, MA.) was used and for Example 12 Insulcast 502 (part A) and Insulcure 9 (part B) manufactured by ITW Performance Polymers (Danvers, MA.), which required a butyl glycidyl ether diluent (Evonik 741). Electrical resistivity measurements were made at Utah State University on the same samples as used for thermal conductivity measurements using a four-probe technique. Table 3 gives compositions and properties.

TABLE 3

Compositions and Properties of Examples 6-12

| Example | Mass (g) | | | | | | | | Viscosity | | Density | % | K |
| | Part A | Part B | 741$^a$ | 9076$^b$ | 990$^c$ | 6011$^d$ | CSC$^e$ | FSC$^f$ | 64 s$^{-1}$ | 333 s$^{-1}$ | (g/cc) | T.D. | (W/mK) |
| --- | --- | --- | --- | --- | --- | --- | --- | --- | --- | --- | --- | --- | --- |
| 6 | 2.4 | 0.6 | 0.0 | 0.09 | 0.06 | 0.0 | 7.97$^g$ | 3.42$^h$ | 13,500 | 9,645 | 2.31 | >99 | 3.1 |
| 7 | 2.4 | 0.6 | 0.0 | 0.09 | 0.06 | 0.10 | 7.97$^g$ | 3.42$^h$ | 25,500 | 7,800 | 2.30 | >99 | 3.2 |
| 8 | 2.4 | 0.6 | 0.0 | 0.09 | 0.06 | 0.0 | 7.97$^i$ | 3.42$^j$ | 27,000 | 10,425 | 2.30 | >99 | 4.1 |
| 9 | 2.4 | 0.6 | 0.0 | 0.09 | 0.06 | 0.10 | 7.97$^i$ | 3.42$^j$ | 26,250 | 11,475 | 2.30 | >99 | 3.7 |
| 10 | 2.4 | 0.6 | 0.0 | 0.09 | 0.06 | 0.10 | 7.97$^k$ | 3.42$^l$ | 53,250 | 12,675 | 2.34 | >99 | 3.6 |
| 11 | 2.4 | 0.6 | 0.0 | 0.09 | 0.06 | 0.10 | 7.97$^m$ | 3.42$^n$ | 25,875 | 16,500 | 2.32 | >99 | 3.5 |
| 12 | 2.92 | 0.38 | 0.5 | 0.09 | 0.06 | 0.10 | 10.04$^g$ | 4.31$^h$ | 34,500 | 9,300 | 2.36 | >99 | 3.6 |

$^a$Epodil 741 diluent, $^b$BYK 9076, $^c$Tego Airex 990, $^d$Xjameter OFS-6011, $^e$coarse SiC, $^f$fine grit SiC, $^g$50 μm crystal SiC, $^h$5 μm crystal SiC, $^i$240 grit SiC, $^j$1200 grit SiC, $^k$oxidized 50 μm crystal SiC, $^l$oxidized 5 μm crystal SiC, $^m$oxidized 240 grit SiC, $^n$oxidized 1200 grit SiC.

Figure 2:
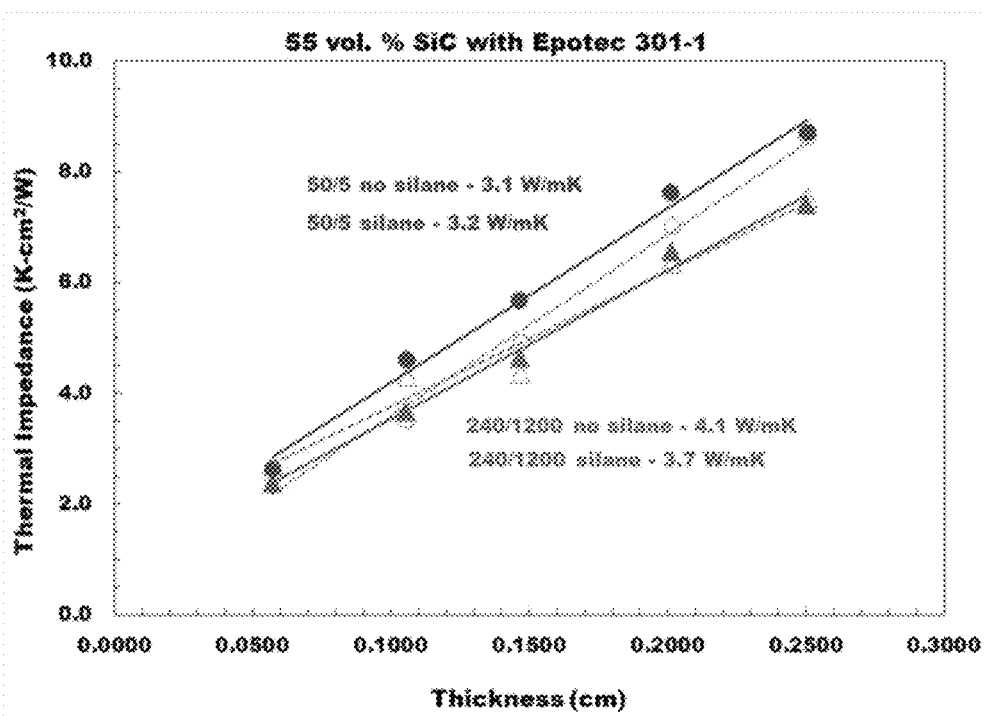
FIG. 2. Size-classified green alpha-SiC filled epoxy (Epo-Tek 301-1) with (solid symbols and solid lines) and without (open symbols and dotted lines) a silane coupling agent added. The wider size distribution 240 grit (70 vol. %)/1200 grit (30 vol. %) had higher thermal conductivity than the narrower 50 µm (70 vol. %)/5 µm (30 vol. %) filler. Silane had no effect on thermal conductivity.
Figure 3:
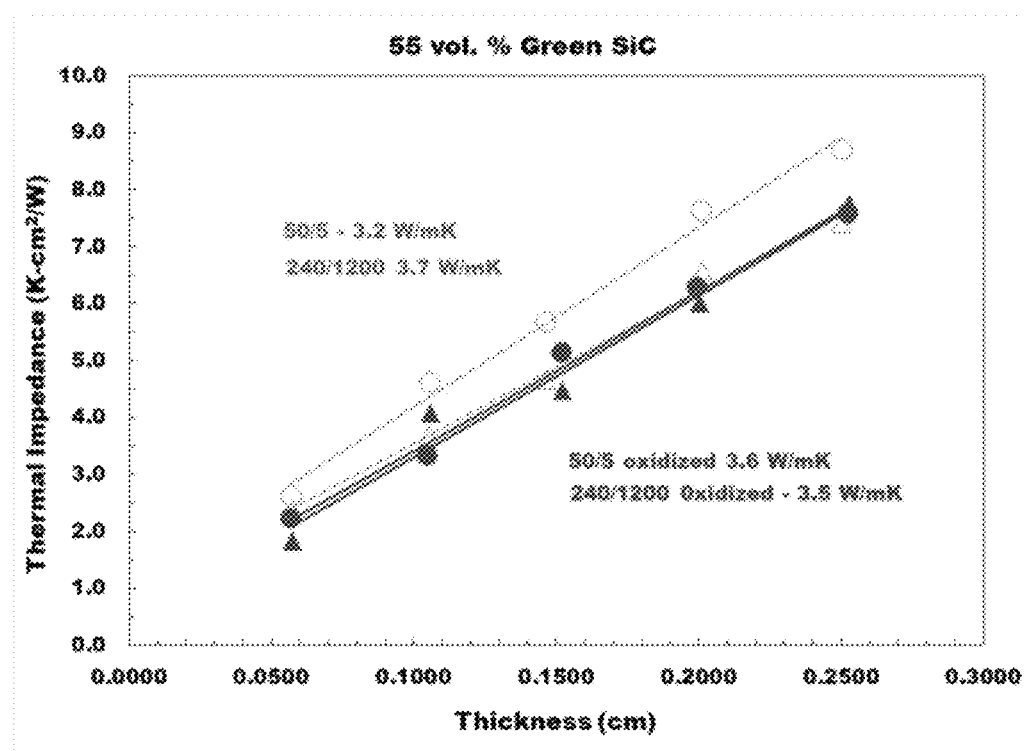
FIG. 3. Thermal impedance as a function of thickness data shows that oxidation of SiC powders had no negative effect on thermal conductivity. Circles represent 50 µm/5 µm powders while 240/1200 grit powder are shown by triangles. Oxidized samples are solid/red while as-received powders are shown by open green symbols.
Figure 4:
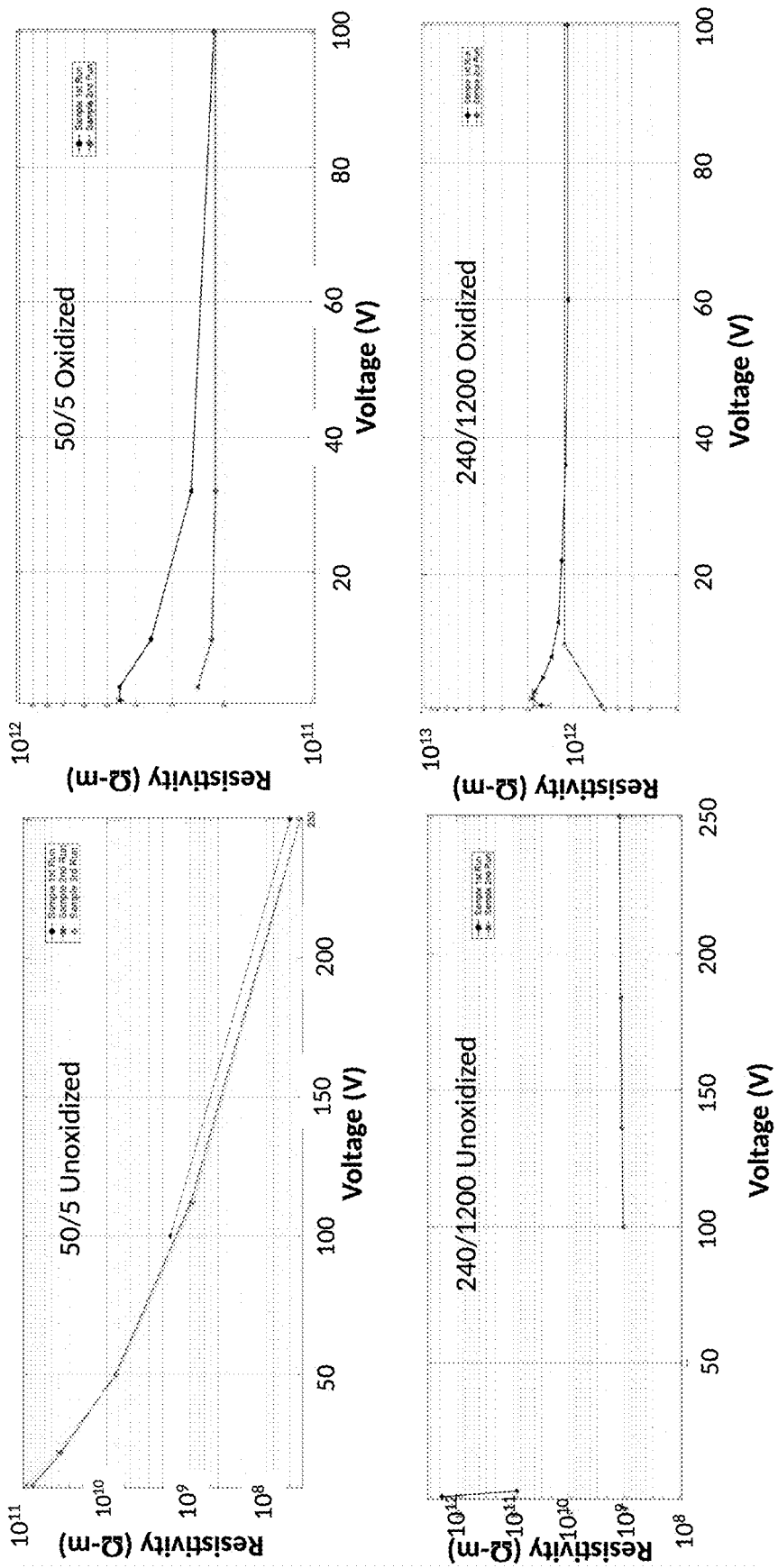
FIG. 4. Electrical resistivity of SiC/epoxy composites with 55 vol. % silicon carbide as a function of applied voltage. The resistivity values for unoxidized samples are on the order of 108 to 109 ohm-m in the 100-250 V range, while the oxidized samples are three orders of magnitude higher in resistivity due to the oxide coating which does not affect the thermal conductivity.

As noted in FIG. 2, the higher purity SiC crystals did not give higher thermal conductivity than the lower cost green SiC grit. It is also easy to see that the use of the silane chosen did not produce improved coupling since there was no noticeable change in thermal conductivity. FIG. 3 shows that the oxidized materials are similar in thermal conductivity to the unoxidized composites. However, the oxidation process had a dramatic effect on the electrical conductivity, as shown by electrical resistivity measurements that are three orders of magnitude higher for the oxidized SiC powders compared to their unoxidized counterparts (see FIG. 4).

experiments, two epoxy (Epo-Tek 301-1) composites were prepared with Panadyne SiC. In Example 18, some of the SiC is replaced with a spherical graphite typical of graphite used in the anodes of lithium batteries. This 25 μm diameter graphite is easy to disperse and makes the composite electrically conducting, which is important for this application. The slips were acoustically mixed in a 125 ml high density polyethylene container as described in Examples 1-5 and cast in silicone molds or tape cast on PET using a doctor blade approach. Dog bone shaped ASTM-D412-Type C were laser cut and pulled with ASTM D 882 line grips using

TABLE 4

Compositions and Properties of Examples 13-16

| Example | Part A | Part B | 9076[a] | 990[b] | 240[c] GWF | 240[c] BWF | 1200[d] GWF | 1200[d] BWF | Viscosity 64 s$^{-1}$ | Viscosity 333 s$^{-1}$ | Density (g/cc) | % T.D. | K (W/mK) |
|---|---|---|---|---|---|---|---|---|---|---|---|---|---|
| 13 | 2.4 | 0.6 | 0.09 | 0.06 | 7.97 | 0.0 | 3.42 | 0.0 | 16,500 | 4,050 | 2.32 | >99 | 2.7 |
| 14 | 2.4 | 0.6 | 0.09 | 0.06 | 0.0 | 7.97 | 0.0 | 3.42 | 21,000 | 5,625 | 2.30 | >99 | 2.8 |
| 15 | 2.4 | 0.6 | 0.09 | 0.06 | 7.97[e] | 0.0 | 3.42[e] | 0.0 | 16,125 | 4,200 | 2.30 | >99 | 2.4 |
| 16 | 2.4 | 0.6 | 0.09 | 0.06 | 0.0 | 7.97[e] | 0.0 | 3.42[e] | 16,125 | 3,300 | 2.30 | >99 | 3.0 |

[a]BYK 9076, [b]Tego Airex 990, [c]240 grit SiC, [d]1200 grit SiC, and [e]oxidized at 1100° C. for 10 hours.

Examples 13-16 (Green vs. Black SiC)

Figure 5:
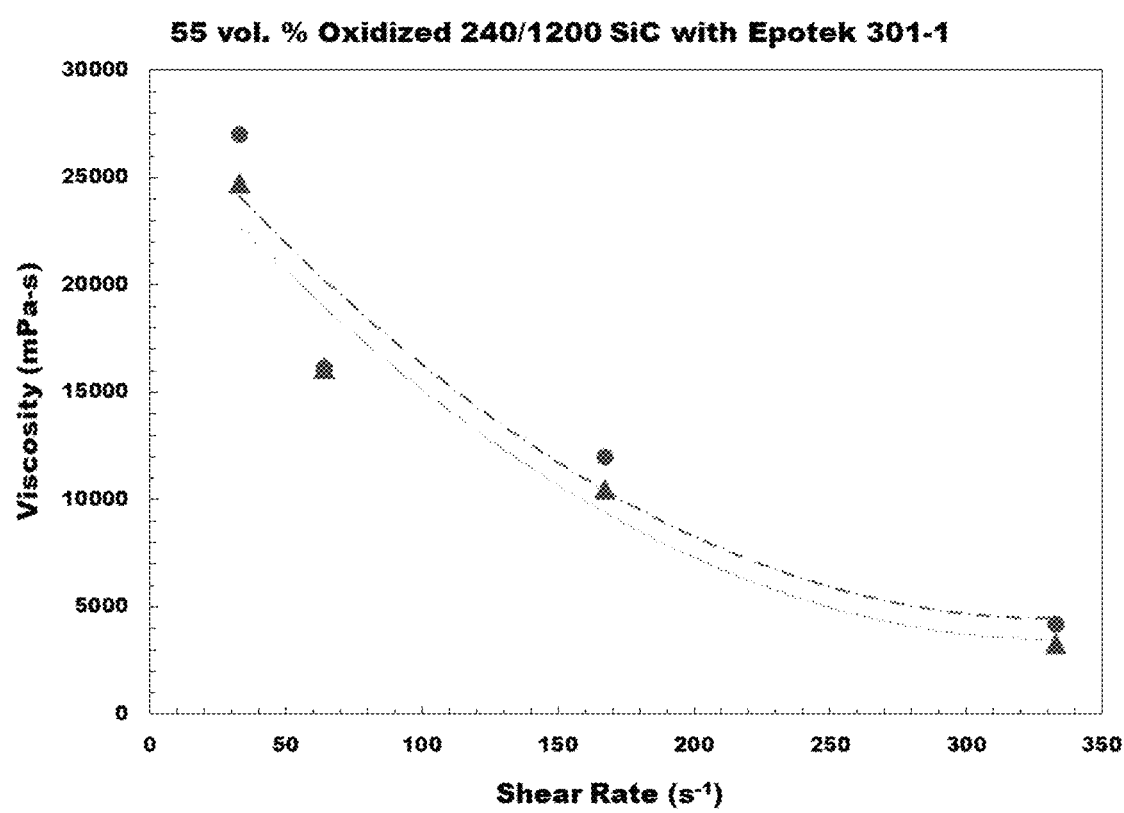
FIG. 5. Viscosity as a function of shear rate at 25° C. for green (circles) and black (triangles) preoxidized SiC (55 vol. % 240 grit/1200 grit) measured with a Brookfield CAP 2000+ cone-on-plate viscometer.

In order to compare green and black SiC, 240 and 1200 grit grades were procured from Washington Mills and some of it was oxidized at 1100° C. for hours (see Table 1). No silane was used in processing of these powders. The green SiC was grade GWF and the black SiC was grade BWF. While no electrical measurements have been made at this time, Table 4 shows the comparison in thermal conductivity. There is no evidence that the higher purity green SiC leads to improvement in thermal conductivity in the composites. The more highly oxidized green SiC (Example 15) is lower in thermal conductivity than the oxidized black SiC (Example 16), but the difference between oxidized and unoxidized samples is within the scatter of the measurement technique. Because the oxidation has such a profound effect on increasing electrical resistivity, it is clear that controlled oxidation is one method for increasing electrical resistivity without greatly impacting the thermal conductivity. FIG. 5 shows that it is possible to make a low viscosity, flowable polymer-SiC composite with oxidized powders. The expectation is that the electrical resistivity of the oxidized powders is orders of magnitude higher than the unoxidized powders.

Examples 17-18

Figure 6A:
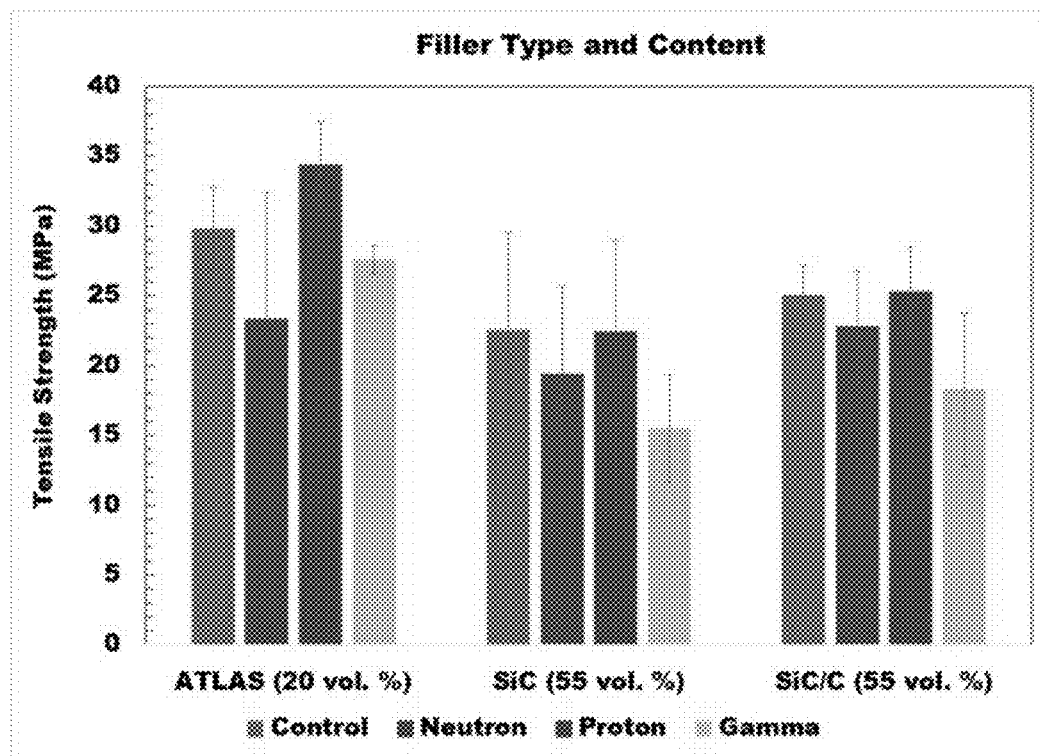
FIGS. 6a, 6b, and 6c. Comparison of tensile strength data for control (no radiation exposure), 1016 neutrons/cm$^2$, $10^{15}$ protons/cm$^2$ at 100 Mrad, and 1Grad gamma radiation for three different filled epoxy compositions. 6a Tensile strength, 6b Young's modulus, and 6c Elongation.
Figure 6B:
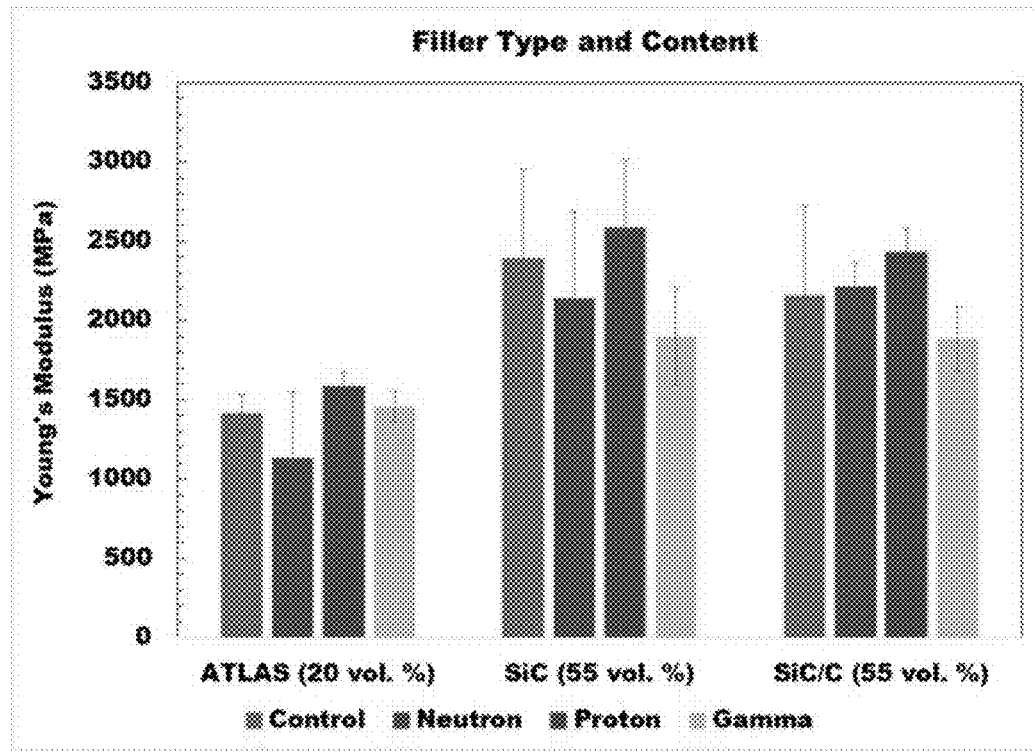
Figure 6C:
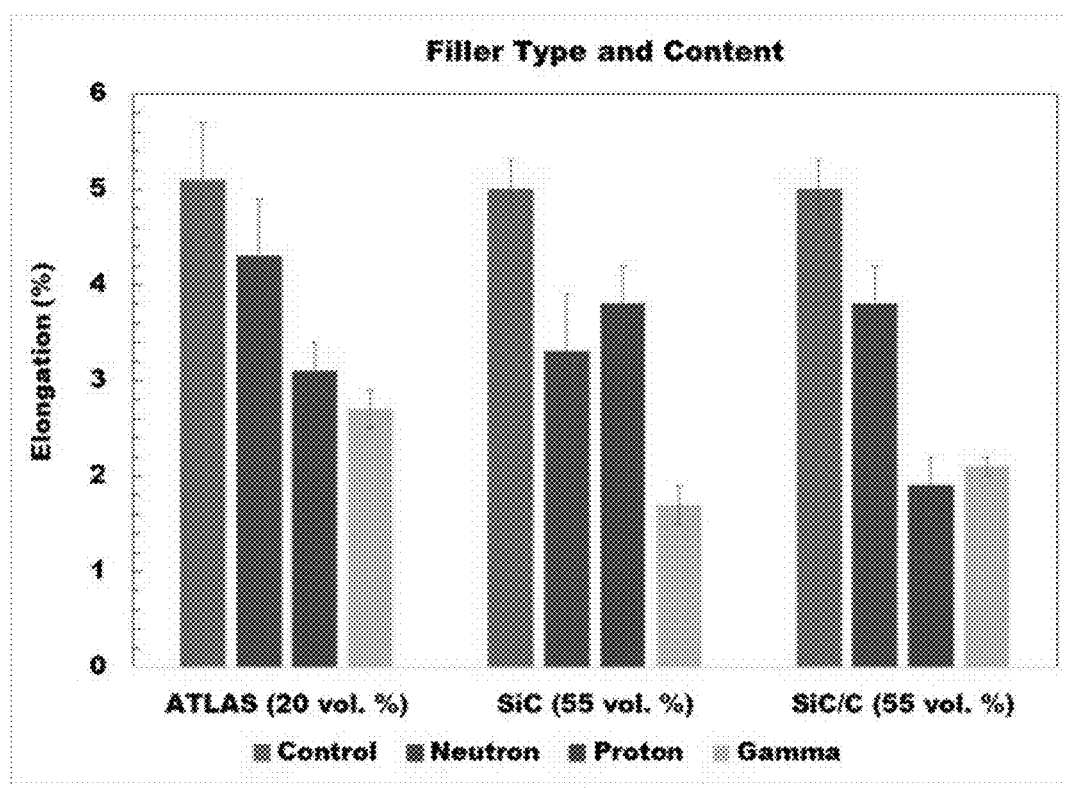

In order to measure tensile properties and compare SiC-polymer composites with a state-of-the-art adhesive used in the Large Hadron Collider (CERN) for high-energy physics a one kN load cell attached to an Instron 5969 testing machine. The strain rate was fixed at 30% per minute. There were about 40 samples for each composition, with 10 samples used as a control, with 10 samples exposed to 1016 neutrons/cm$^2$ at Mcclellan (UC Davis) laboratory, ten other samples exposed to $10^{15}$ protons/cm$^2$ at >100 mega rad at Crocker (UC Davis) laboratory, and ten samples exposed to 1 giga rad gamma radiation at Sandia National Laboratory. Table 5 shows properties of the two materials. Examples 17 and 18 are compared to a radiation-resistant epoxy (Hysol 9396) containing 20 vol. % graphite in FIG. 6. As shown by the tensile data, the incorporation of SiC increases the stiffness of the composite, consistent with expectations. Surprisingly, the SiC composites have excellent radiation resistance and can be used in high-energy physics experiments, if desired.

TABLE 5

Compositions and Properties of Examples 17 and 18

| Example | Part A | Part B | 9076[a] | 990[b] | 240[c] | 1200[d] | C[e] | Viscosity 64 s$^{-1}$ | Viscosity 333 s$^{-1}$ | Density (g/cc) | % T.D. | K (W/mK) |
|---|---|---|---|---|---|---|---|---|---|---|---|---|
| 17 | 24.0 | 8.0 | 0.9 | 0.6 | 79.73 | 34.17 | 0.0 | Not measured | | 2.30 | >99 | 3.2 |
| 18 | 24.0 | 8.0 | 0.75 | 0.25 | 52.50 | 22.50 | 30.0 | Not measured | | 2.10 | >99 | 3.1 |

[a]BYK 9076, [b]Tego Airex 990, [c]240 grit SiC, [d]1200 grit SiC, and [e]G25 spherical graphite.

Polymer-SiC composites can also be processed with low viscosity urethanes (e.g., BASF grade PUR 1120) where the solvent evaporates and leaves a flexible material with low adhesive strength. Thermosetting low-viscosity silicones are also available (e.g., Elkem ESA 6016). As with epoxies, there are a wide variety of properties possible with other polymer systems. The aforementioned examples show that it is possible to make inexpensive polymer-SiC composites with both high thermal conductivity and high electrical resistivity, while maintaining flowability. There are many exciting options using this technology.

In order to increase the dielectric strength of the SiC-polymer composites, it is advantageous to add another dielectric with higher dielectric strength than the oxidized SiC particles. The ceramic with higher dielectric strength can be an oxide, nitride, oxynitride, or other phase with electrical resistivity greater than 1014 ohm-cm. The volume fraction of the additional phase or phases can be tailored to give the desired dielectric strength. Examples 19-23 show that it is possible to obtain high volume loading of dielectric particles while maintaining low enough viscosity that the system is fluid and flows easily.

Examples 19-23

Spherical AlN particles are commercially available and have both high dielectric strength and high thermal conductivity. They are, however, expensive relative to oxidized SiC, costing one to two orders of magnitude more for the same volume of material. Sixty volume % ceramic fillers were made, using the oxidized SiC and as-received AlN powders. AlN was purchased either from ThruTek (Kaohsiung, Taiwan) through their U.S. distributor (United Mineral Co., Lyndhurst, NJ) or from Luoyang Tonggrun Info Technology Co., Ltd. (Henan, China) in sizes ranging from 5 μm to 55 μm. The materials were loaded into 60 ml polypropylene bottles adding part B Epo-Tek, BYK 9076, Tego Airex 990, ceramic powders, and finally part A Epo-Tek epoxy. The Resodyn LabRam I mixed each slurry at 80 g without deairing for six minutes, followed by deairing under vacuum at 40 g for 3 minutes, before casting into silicone molds. Viscosity data are given in Table 6 for each of the slurries, which poured easily into the molds. The theoretical density was calculated as 2.41 g/cc for all five examples. Thermal conductivity was measured with a transient plane source technique (model TPS 500(s), Hot Disk, Gothenburg, Sweden) where 60 vol. % AlN ranged between 2.5 and 2.8 W/mK depending on the source and particle size of the aluminum nitride particles. The measurement of dielectric properties was not made for these samples.

thermal conductivity greater than 2.0 W/mK at 25° C., and a porosity less than 5% by volume.

2. The thermal interface material of claim 1 wherein the surface oxide layer of at least a portion of the silicon carbide particles is greater than nm in thickness.

3. The thermal interface material of claim 1 wherein the volume electrical resistivity is greater than $1 \times 10^{11}$ ohm-cm at 25° C. and 100 V, and the thermal conductivity is greater than 2.5 W/mK at 25° C.

4. The thermal interface material of claim 1 wherein the thermal conductivity is greater than 3.0 W/mK at 25° C.

5. The thermal interface material of claim 1 wherein the thermal interface material is selected from the group consisting of bulk heat sinks, potting compounds, adhesives and high-temperature filled cements.

6. The thermal interface material of claim 1 wherein the polymer matrix is selected from the group consisting of epoxy, urethane and silicone polymers, and combinations thereof.

7. The thermal interface material of claim 1 wherein the silicon carbide particles have a bimodal size distribution.

8. The thermal interface material of claim 1 wherein the volume loading of silicon carbide particles exceeds 50%.

9. The thermal interface material of claim 1 wherein the surface oxide layer is a native oxide layer on the silicon carbide particles that has been increased by thermal oxidation.

10. The thermal interface material of claim 1 where the silicon carbide particles are comprised of alpha-SiC grits subjected to an oxidation treatment prior to mixing with the polymer.

11. The thermal interface material of claim 1 additionally comprising particles with a higher dielectric strength than the silicon carbide particles.

12. The thermal interface material of claim 1 additionally comprising particles of one or more from the group consisting of oxides, nitrides, oxynitrides and combinations thereof.

TABLE 6

Compositions and Properties of Examples 19-23

| | Mass (g) | | | | | | Viscosity | | Density | % |
|---|---|---|---|---|---|---|---|---|---|---|
| Example | Part A | Part B | 9076$^a$ | 990$^b$ | 240$^c$ | 1200$^d$ | AlN | 64 s$^{-1}$ | 333 s$^{-1}$ | (g/cc) | T.D. |
| 19 | 8.1 | 2.0 | 0.09 | 0.06 | 15.05 | 6.45 | 21.9$^a$ | 20,250 | 6,750 | 2.40 | >99 |
| 20 | 8.1 | 2.0 | 0.09 | 0.06 | 30.00 | 0.00 | 13.1$^f$ | 22,125 | 2,175 | 2.39 | >99 |
| 21 | 8.1 | 2.0 | 0.09 | 0.06 | 0.0 | 12.85 | 30.55$^g$ | 15,000 | 4,050 | 2.40 | >99 |
| 22 | 8.1 | 2.0 | 0.09 | 0.06 | 0.0 | 12.85 | 30.55$^h$ | 17,250 | 4,425 | 2.40 | >99 |
| 23 | 8.1 | 2.0 | 0.09 | 0.06 | 0.0 | 12.85 | 30.55$_e$ | 37,875 | 750 | 2.40 | >99 |

$^a$BYK 9076, $^b$Tego Airex 990, $^c$240 grit Panadyne SiC oxidized at 1050° C. for 10 hours, $^d$1200 grit Panadyne SiC oxidized at 1050° C. for 10 hours, $^e$15.33 g TR-50 and 6.57 g TR-10, $^f$TR-10, $^g$TR-50, $^h$550RWE, $^i$330RWE.

The invention has been described with reference to various specific and preferred embodiments and techniques. Nevertheless, it is understood that many variations and modifications may be made while remaining within the spirit and scope of the invention.

What is claimed is:

1. A thermal interface material comprising silicon carbide particles in a polymer matrix, wherein a majority of the silicon carbide particles are greater than one micrometer in diameter and have a sufficient surface oxide layer to obtain in the thermal interface material a volume electrical resistivity greater than $1 \times 10^{10}$ ohm-cm at 25° C. and 100 V, and wherein the thermal interface material comprises a volume loading of the silicon carbide particles sufficient to obtain a 13. The thermal interface material of claim 1 additionally comprising aluminum nitride particles.

14. An adhesive material comprising thermally conductive silicon carbide particles in a polymer matrix, wherein:

(a) a majority of the silicon carbide particles are greater than one micrometer in diameter and have a sufficient surface oxide layer to (i) obtain in the adhesive material a volume electrical resistivity greater than $1 \times 10^{10}$ ohm-cm at 25° C. and 100 V, and (ii) retain in the silicon carbide particles having the surface oxide layer a thermal conductivity of at least 90% of the thermal conductivity of the silicon carbide particles without the surface oxide layer;

(b) the adhesive material comprises a porosity less than 5% by volume; and (c) the adhesive material is characterized by a flowability sufficient to wet a surface during application to the surface at a volume loading of 50% or more of silicon carbide particles.

15. The adhesive material of claim 14 wherein the adhesive material comprises at least 50% by volume of the silicon carbide particles.

16. The adhesive material of claim 14 wherein the surface oxide layer on at least a majority of the silicon carbide particles is less than 10% by volume of the total volume of the silicon carbide particles.

17. The adhesive material of claim 14 further comprising additional particles with a higher dielectric strength than the silicon carbide particles.

18. The adhesive material of claim 17 wherein the additional particles are selected from the group consisting of oxides, nitrides, and oxynitrides and combinations thereof.

19. The adhesive material of claim 17 comprising at least 60% by volume of a combination of silicon carbide particles and additional particles, wherein the combination has a bimodal particle size distribution, a majority of the silicon carbide particles are less than or equal to 15 micrometers in diameter, and a majority of the additional particles are greater than or equal to 5 micrometers in diameter.

20. The adhesive material of claim 14 wherein the polymer matrix comprises at least one polymer selected from thermoset polymers and thermoplastic polymers and combinations thereof.

21. The adhesive material of claim 14 wherein the polymer matrix is selected from the group consisting of epoxy, urethane and silicone polymers, and combinations thereof.

22. An adhesive material comprising silicon carbide particles in a polymer matrix, wherein:

(a) a majority of the silicon carbide particles are greater than one micrometer in diameter and have a sufficient surface oxide layer to obtain in the adhesive material a volume electrical resistivity of the composite greater than $1\times10^{10}$ ohm-cm at 25° C. and 100 V;

(b) the adhesive material comprises a volume loading of the silicon carbide particles sufficient to obtain a thermal conductivity in the adhesive material greater than 2.0 W/mK at 25° C.; and (c) the silicon carbide particles have a bimodal particle size distribution.

23. The adhesive material of claim 22 wherein the silicon carbide particles have a bimodal average particle size distribution resulting in a diameter ratio of at least 7:1 of coarse-to-fine size particles.

24. The adhesive material of claim 22 wherein the silicon carbide particles have a bimodal average particle size distribution resulting in a green density ratio of about 2.3:1 coarse-to-fine size particles.

25. The adhesive material of claim 22 wherein the adhesive material comprises at least 50% by volume of the silicon carbide particles.

26. The adhesive material of claim 22 wherein the polymer matrix comprises at least one polymer selected from thermoset polymers and thermoplastic polymers and combinations thereof.

27. The adhesive material of claim 22 wherein the polymer matrix is selected from the group consisting of epoxy, urethane and silicone polymers, and combinations thereof.

28. A radiation resistant adhesive comprising the adhesive material of claim 22.

* * * * *